United States Patent
Nakano

(10) Patent No.: US 11,315,867 B2
(45) Date of Patent: Apr. 26, 2022

(54) EXTERNAL CONNECTION PART OF SEMICONDUCTOR MODULE, SEMICONDUCTOR MODULE, EXTERNAL CONNECTION TERMINAL, AND MANUFACTURING METHOD OF EXTERNAL CONNECTION TERMINAL OF SEMICONDUCTOR MODULE

(71) Applicant: FUJI ELECTRIC CO., LTD., Kanagawa (JP)

(72) Inventor: Hayato Nakano, Kofu (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 225 days.

(21) Appl. No.: 16/735,696

(22) Filed: Jan. 7, 2020

(65) Prior Publication Data
US 2020/0258834 A1    Aug. 13, 2020

(30) Foreign Application Priority Data
Feb. 8, 2019    (JP) ............................. JP2019-021711

(51) Int. Cl.
*H01L 23/50*    (2006.01)
*H01R 4/34*    (2006.01)

(52) U.S. Cl.
CPC ............ *H01L 23/50* (2013.01); *H01R 4/34* (2013.01)

(58) Field of Classification Search
CPC ................................. H01L 23/50; H01R 4/34
See application file for complete search history.

(56) References Cited

U.S. PATENT DOCUMENTS

| | | | |
|---|---|---|---|
| 4,694,322 A * | 9/1987 | Sakurai | ................... H01L 23/40 257/712 |
| 5,373,105 A * | 12/1994 | Nagaune | ................. H01L 23/04 174/539 |
| 5,763,946 A | 6/1998 | Nakadaira | |

FOREIGN PATENT DOCUMENTS

| JP | H0592971 A | 4/1993 |
|---|---|---|
| JP | H0592971 U | 12/1993 |
| JP | H0945831 A | 2/1997 |
| JP | 2002324819 A | 11/2002 |

OTHER PUBLICATIONS

Watabe Masaru, et al., A Study of Reliability on the Terminal with Large Current on Hybrid Electric Vehicles, published in the presentation of Japan Automotive Engineering College Association on Aug. 6, 2009, p. 7-p. 10.

* cited by examiner

*Primary Examiner* — Peniel M Gumedzoe

(57) ABSTRACT

An external connection terminal of a semiconductor module is provided. The external connection terminal includes a conductor having an upper surface and a lower surface; a plated layer configured to cover the upper surface of the conductor; and a nut provided on the lower surface-side of the conductor for receiving a screw penetrating the conductor. The plated layer includes a low contact resistance region overlapping a region in which the nut is provided, and a high contact resistance region that is a region except the low contact resistance region, as seen from above, and the plated layer includes a convex portion and a concave portion on a surface in the high contact resistance region.

14 Claims, 16 Drawing Sheets

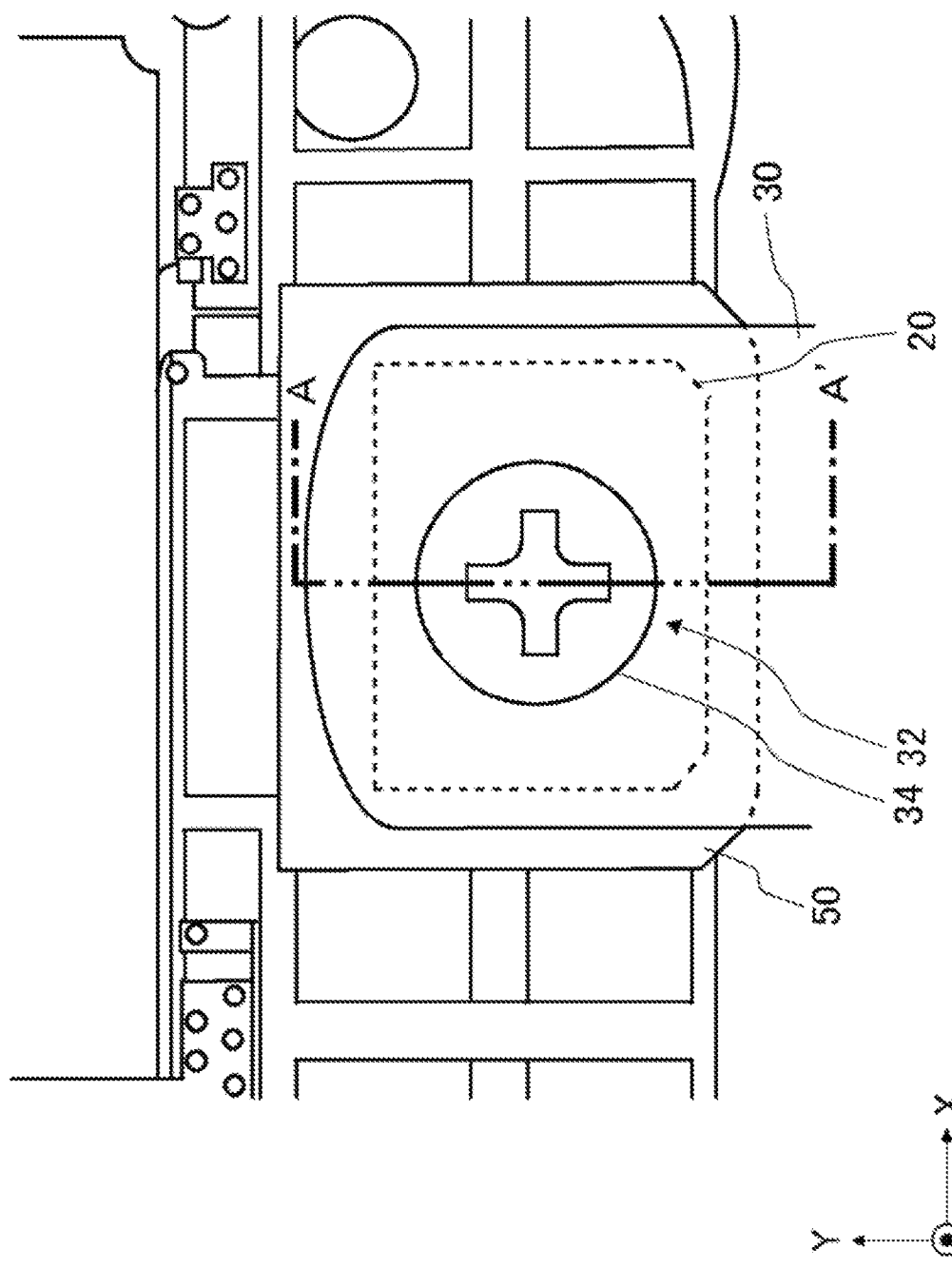

EXTERNAL CONNECTION PART OF SEMICONDUCTOR MODULE, SEMICONDUCTOR MODULE, EXTERNAL CONNECTION TERMINAL, AND MANUFACTURING METHOD OF EXTERNAL CONNECTION TERMINAL OF SEMICONDUCTOR MODULE

The contents of the following Japanese patent application are incorporated herein by reference:
NO. 2019-021711 filed in JP on Feb. 8, 2019

BACKGROUND

1. Technical Field

The present invention relates to an external connection part of a semiconductor module, a semiconductor module, an external connection terminal, and a manufacturing method of an external connection terminal of a semiconductor module.

2. Related Art

In the related art, an external connection terminal of a semiconductor device has a malfunction problem due to a high contact resistance of the external connection terminal. (for example, refer to Patent Document 1)

CITATION LIST

[Patent Document]
Patent Document 1] Japanese Patent Application Publication No. H09-45831

SUMMARY

An object of the present invention is to provide an external connection terminal of a semiconductor module having a low contact resistance.

In order to achieve the above object, a first aspect of the present invention provides an external connection part of a semiconductor module. An external connection part includes a conductor having an upper surface and a lower surface; a plated layer configured to cover the upper surface of the conductor; and a nut provided on the lower surface-side of the conductor for receiving a screw penetrating the conductor, wherein the plated layer includes a low contact resistance region overlapping a region in which the nut is provided, and a high contact resistance region that is a region except the low contact resistance region, as seen from above, and the plated layer includes a convex portion and a concave portion on a surface in the high contact resistance region.

A depth from a top surface of the convex portion to a bottom surface of the concave portion may be between 1.5 µm and 2.5 µm.

The convex portion may have a width between 20 µm and 1 mm.

The convex portion may have a quadrangular shape, as seen from above.

The convex portion may have a circular shape, as seen from above.

The concave portion may have a width between 20 µm to 1 mm.

The plated layer may include nickel.

The plated layer may not include a convex portion and a concave portion on a surface in the low contact resistance region.

A depth from a surface of the plated layer to the upper surface of the conductor in the high contact resistance region may be the same as a corresponding depth in the low contact resistance region.

A depth from a surface of the plated layer to the upper surface of the conductor in the high contact resistance region may be greater than a corresponding depth in the low contact resistance region.

A pattern layer may be provided between the conductor and the plated layer.

No pattern layer may be provided between the conductor and the plated layer.

A second aspect of the present invention provides a semiconductor module. The semiconductor module includes the external connection part, a case, an insulating substrate housed in the case; and a semiconductor chip electrically connected to the external connection part and provided above the insulating substrate.

A third aspect of the present invention provides an external connection terminal of a semiconductor module. The external connection terminal of the semiconductor module includes a conductor having an upper surface and a lower surface; a plated layer configured to cover the upper surface of the conductor; and a screw hole formed to penetrate the conductor and the plated layer. The plated layer includes a low contact resistance region having a preset area and surrounding the screw hole, and a high contact resistance region except the low contact resistance region, as seen from above. The plated layer includes a convex portion and a concave portion on a surface in the high contact resistance region.

A fourth aspect of the present invention provides a manufacturing method of an external connection terminal of a semiconductor module. The manufacturing method of an external connection terminal of a semiconductor module includes providing a conductor having an upper surface and a lower surface; covering the upper surface of the conductor with a plated layer; providing a pattern layer in a predetermined region on a surface of the plated layer; and performing reverse sputtering on the plated layer by using the pattern layer as a mask.

In the meantime, the summary of the present invention does not necessarily describe all necessary features of the present invention. The present invention may also be a sub-combination of the features described above.

BRIEF DESCRIPTION OF THE DRAWINGS

FIG. 1B is an enlarged view of an upper surface of an external connection part 20 when it is externally connected.

DESCRIPTION OF EXEMPLARY EMBODIMENTS

Hereinbelow, embodiments of the present invention will be described. However, the embodiments do not limit the invention defined in the claims. Also, all combinations of features described in the embodiments are not necessarily essential to solving means of the invention.

In the specification, one side in a direction parallel to a depth direction of a semiconductor module is referred to as "upper" and the other side is referred to as "lower". One surface of two principal surfaces of a substrate, a layer or other member is referred to as an upper surface, and the other surface is referred to as a lower surface. The directions "upper" and "lower" are not limited to a gravity direction or an attaching direction to a substrate or the like when installing a semiconductor chip.

Figure 1A:
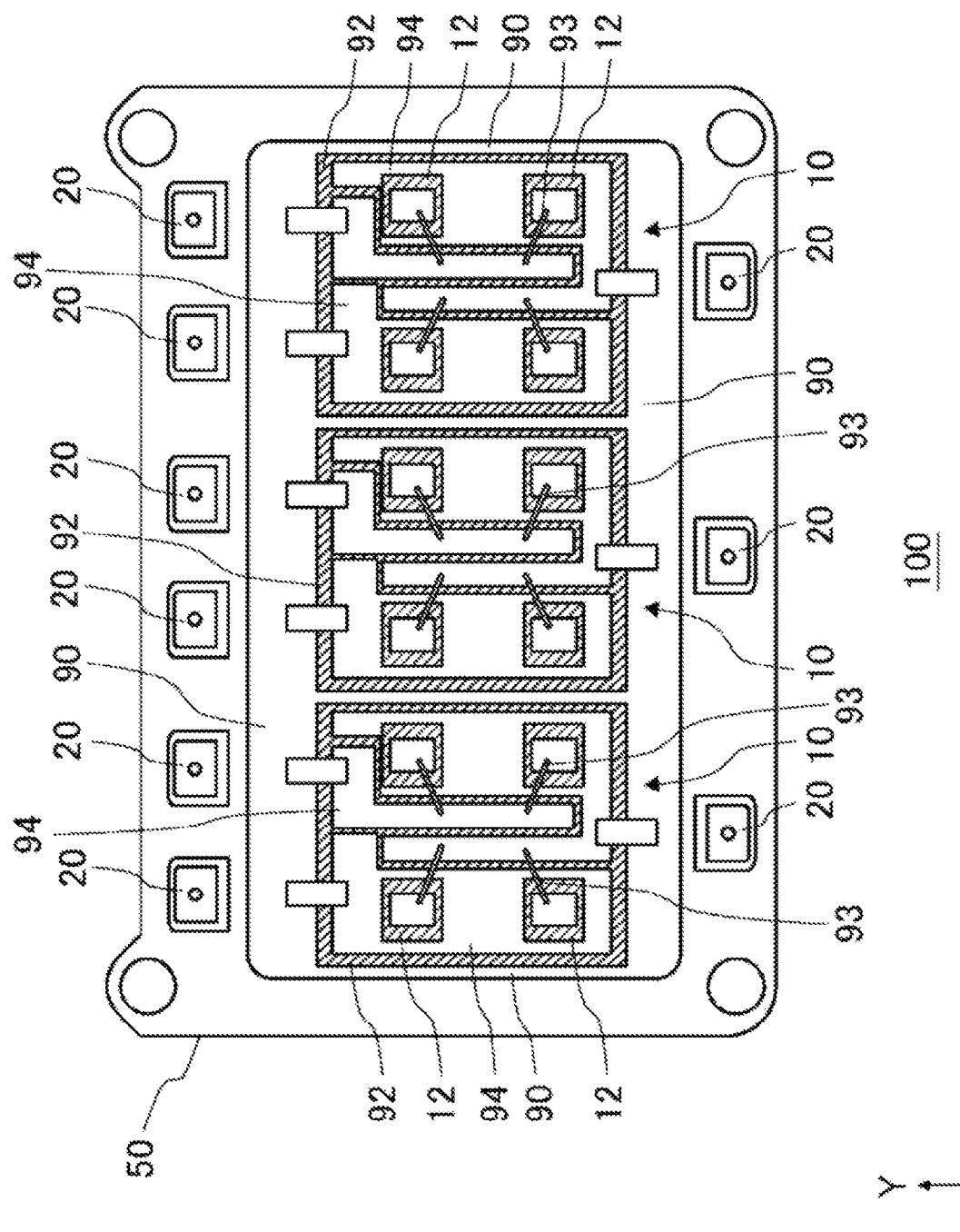
FIG. 1A is a schematic view of an upper surface of a semiconductor module 100.

FIG. 1A is a schematic view of an upper surface of a semiconductor module 100. The semiconductor module 100 includes a case 50, semiconductor cells 10 housed in the case 50, and external connection parts 20. In the specification, a long side direction of the case 50 having a rectangular shape, as seen from above in FIG. 1A, is referred to as 'X-axis' and a short side direction is referred to as 'Y-axis'. For example, the semiconductor module 100 is an intelligent power module (IPM). Also, as regards the X-axis direction and Y-axis direction, as a direction configuring a right-handed system, a direction of a side of the semiconductor module 100 on which the semiconductor cell 10 is provided is referred to as 'Z-axis direction'. The description 'as seen from above' indicates a direction in which the semiconductor module 100 is seen from a positive direction of the Z-axis.

The semiconductor cell 10 includes an insulating substrate, and a plurality of semiconductor chips 12 arranged on the insulating substrate. The insulating substrate may include an insulating plate 92 and a circuit layer 94. The semiconductor cell 10 may further include a conductive member 93. The conductive member 93 is, for example, a wire, a ribbon, a clip and the like. The insulating plate 92, the circuit layer 94, and the semiconductor chip 12 may be sequentially arranged in the Z-axis direction. The semiconductor chip 12 includes a switching element such as metal-oxide semiconductor field-effect transistor (MOS-FET), insulated gate bipolar transistor (IGBT), reverse-conducting IGBT (RC-IGBT), and the like. The RC-IGBT is a device including an IGBT and a free wheel diode (FWD) in the same chip. Also, the semiconductor module 100 may be a three-phase inverter module having a U-phase, a V-phase, and a W-phase. In the semiconductor cell 10, the circuit layer 94, the semiconductor chip 12, and the conductive member 93 may be electrically connected to configure a half bridge circuit. The circuit layer 94 may be electrically connected to the external connection part 20.

Main current of the semiconductor module 100 is input or output to the external connection part 20. The external connection part 20 is electrically connected to the semiconductor chip 12. Whether the current is output or input through the external connection part 20 is set according to a use purpose of the corresponding semiconductor module 100 and is not limited to any one aspect. In a case in which the semiconductor module 100 is a three-phase inverter module, currents for driving a U-phase, a V-phase, and a W-phase are input or output to the external connection part 20.

The case 50 is formed of a resin such as a thermosetting resin capable of being formed by injection molding, an ultraviolet setting resin capable of being formed by UV formation, and the like. The resin for forming the case 50 includes, for example, one or more polymer materials selected from polyphenylene sulfide (PPS) resin, polybutylene terephthalate (PBT) resin, polyamide (PA) resin, acrylonitrile butadiene styrene (ABS) resin, and acryl resin.

A bottom plate 90 is provided below the insulating substrate on which the semiconductor chips 12 are mounted. The bottom plate 90 may be a plate-shaped metal plate having a plane parallel to an XY plane. As an example, the bottom plate 90 is formed of metal including aluminum, copper, and the like.

The insulating substrate may be a stacked substrate in which an insulating plate 92 having an upper surface and a lower surface, a circuit layer 94 provided on the upper surface of the insulating plate 92 and a metal layer (not shown) provided on the lower surface are included in this order, for example. The insulating substrate may be, for example, a direct copper bonding (DCB) substrate or an active metal brazing (AMB) substrate. The insulating plate 92 may also be formed of a ceramics material such as alumina ($Al_2O_3$), aluminum nitride (AlN), silicon nitride ($Si_3N_4$), and the like. The circuit layer 94 and the metal layer may be plate materials including a conductive material such as copper, copper alloy, and the like.

FIG. 1B is an enlarged view of an upper surface of the external connection part 20 when it is externally connected. The external connection part 20 is externally connected by a bus bar 30. The description 'when it is externally connected' indicates a state in which the external connection part and the bus bar 30 are fastened together by a screw 32. A periphery of the external connection parts is surrounded by the case 50.

The bus bar 30 is a plate-shaped conductor. The bus bar 30 may be a plate-shaped conductive member formed of metal such as copper. In the present example, the bus bar 30 is formed to cover the entire external connection part. A size of the bus bar 30, as seen from above, is not limited thereto inasmuch as the bus bar can be fastened together by the screw 32.

As an example, the bus bar 30 has a thickness of 3 mm or greater. The bus bar 30 having such a thickness can supply power even in a case in which the semiconductor module 100 is a power module using larger current of 800 A or higher The screw 32 fastens the external connection part 20 and the bus bar 30. The screw 32 has a screw head 34. As an example, the screw head 34 has a circular shape. The shape of the screw head 34 is not limited to the circular shape, and may be a polygonal structure such as a hexagon. The screw head 34 is formed with a cross hole. A type of the hole formed in the screw head 34 is not limited to the cross hole As an example, a size of the screw 32 may be an M4 screw to an M6 screw.

Figure 1C:
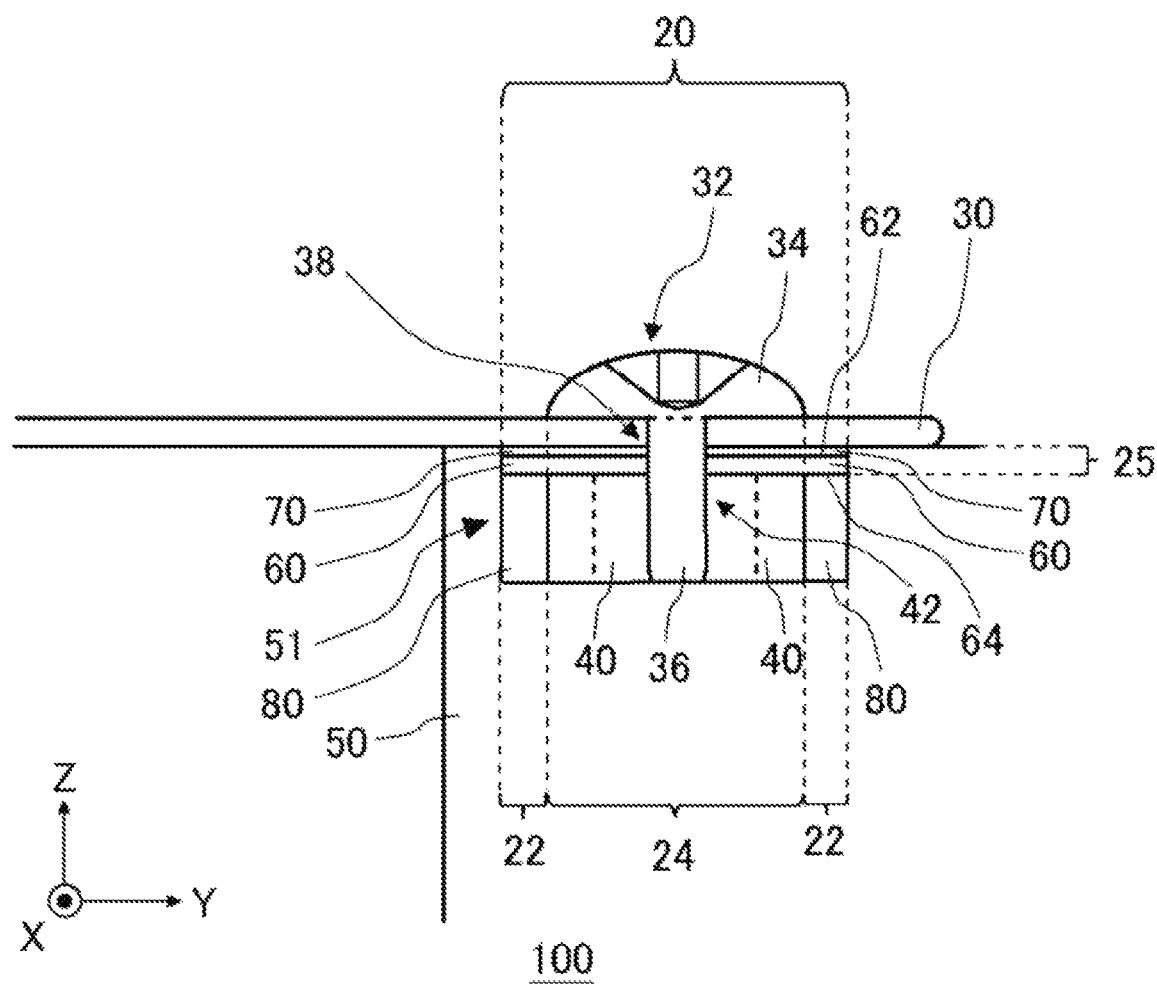
FIG. 1C is a sectional view of the external connection part 20 when it is externally connected.

FIG. 1C is a sectional view of the external connection part 20 when it is externally connected. The external connection part 20 provided on the case 50 is shown. FIG. 1C is an example of a sectional view taken along a line A-A' of FIG. 1B.

The external connection part 20 includes an external connection terminal 25, and a nut 40. The external connection terminal 25 includes a conductor 60 having an upper surface 62 and a lower surface 64, a plated layer 70 provided on the upper surface 62 of the conductor 60, and a screw hole 38 formed to penetrate the conductor 60 and the plated layer 70. In the case 50 of the semiconductor module 100, the nut 40 provided on the lower surface 64-side of the conductor 60, and a resin 80 for sealing in the nut 40 in the case 50 are provided. The external connection part 20 is fastened together with the bus bar 30 by the screw 32 and is thus externally connected. The screw 32 and the nut 40 may be formed of metal selected from alloys of iron, copper, aluminum and the like or may be formed of reinforced plastic.

The screw 32 has a screw head 34 and a screw portion 36. The screw portion 36 is screwed into the nut 40, so that the screw 32 fastens the bus bar 30 together. The screw 32 passes through the screw hole 38, penetrates the conductor 60 of the external connection terminal 25, and is then screwed into a nut hole 42 of the nut 40, thereby fastening the bus bar 30 together with the external connection terminal 25.

The nut 40 is provided on the lower surface 64-side of the external connection terminal 25. The nut 40 has the nut hole 42 which is concentric with the screw hole 38. The nut 40 is accommodated in an accommodation part 51 provided in the case 50 below the lower surface 64 of the external connection terminal 25, and is fixed to the position at which the centers of the screw hole 38 and the nut hole 42 coincide with each other.

The nut 40 is resin-sealed and fixed in the accommodation part 51 of the case 50 by the resin 80, for example. The nut 40 may be fitted to the accommodation part 51 having an opening and provided in the case 50 so that the nut 40 is not to rotate, without providing the resin 80, or may be embedded in the accommodation part 51. Also, the nut 40 may be formed integrally with the case 50 (insert formation). A depth of the nut 40 at the fixing position is determined, according to an entire design of the semiconductor module 100 such as a length of the screw 32.

When the screw 32 is screwed into the nut hole 42, large torque is applied to a region sandwiched between the nut 40 and the screw head 34 in a direction in which the external connection terminal 25 and the bus bar 30 are pressed against each other. That is, a low contact resistance region 24 (which will be described later) receives large fastening torque from the nut 40 and the screw head 34.

The accommodation part 51 and the nut 40 may be sealed therebetween by the resin 80. A material of the resin 80 is not particularly limited inasmuch as the material can be solidified at room temperatures and fix a position of the nut.

The conductor 60 is formed of a conductive material. For example, the material of the conductor 60 is copper.

As an example, a depth from the upper surface 62 to the lower surface 64 of the conductor 60 is 1 mm. The conductor 60 is set to have a thickness that makes it sufficiently durable against buckling due to the fastening torque from the nut 40 and the screw head 34. Also, the conductor 60 is set to have a thickness capable of sufficiently transmitting current of the external connection terminal 25 to the semiconductor module 100.

In this way, the thickness of the conductor 60 is set, according to stiffness and conductivity of the material to be selected as the conductor 60. When other material is used for the conductor 60, the conductor may be set to have a different thickness, according to physical properties of the material to be used for the conductor 60.

The plated layer 70 is provided on the upper surface 62 of the conductor 60. The plated layer 70 is provided to protect the conductor 60 against influences of external environments such as oxidation, damage due to shock, and the like. For example, the plated layer 70 is configured to suppress increase of a contact resistance due to smudge on a surface of the conductor 60. A material of the plated layer 70 is nickel plating, for example. Also, matte nickel, silver, copper tin, gold, or the like may be used for the plated layer 70. In a case in which nickel plating is used for the plated layer 70, it is possible to provide plating that is resistant to smudge, elementally stable and resistant to corrosion and has high hardness at low cost.

A contact surface is provided between the external connection terminal 25 and the bus bar 30. More specifically, the contact surface is provided between the plated layer 70 of the external connection terminal 25 and the bus bar 30. The external connection terminal 25 is pressed against the bus bar 30 by the fastening torque acting between the screw 32 and the nut 40. A contact resistance of the external connection terminal 25 with the bus bar 30 is reduced by the fastening torque. The contact surface between the external connection terminal 25 and the bus bar 30 can be classified into a high contact resistance region 22 and a low contact resistance region 24, according to a magnitude of the contact resistance.

The high contact resistance region 22 is a region in which the contact resistance between the external connection terminal 25 and the bus bar 30 is greater than in the low contact resistance region 24. For example, the high contact resistance region 22 is a region in which the nut 40 is not provided. That is, in the high contact resistance region 22, the screw 32 is fastened, so that the fastening torque less than in the low contact resistance region 24 is generated for the bus bar 30.

The low contact resistance region 24 is a region in which the contact resistance between the external connection terminal 25 and the bus bar 30 is less than in the high contact resistance region 22. For example, the low contact resistance region 24 is a region in which the nut 40 is provided. That is, in the low contact resistance region 24, the screw 32 is fastened, so that the fastening torque greater than in the high contact resistance region 22 is generated for the bus bar 30.

Since the low contact resistance region 24 is a region in which the high fastening torque from the screw 32 and the nut 40 is applied, the low contact resistance region 24 may be defined to surround the screw hole 38, as seen from above. In the meantime, the high contact resistance region 22 may be defined to surround the low contact resistance region 24 at a periphery of the low contact resistance region 24, as seen from above.

In the present example, the low contact resistance region 24 is defined by the region in which the nut 40 is provided.

However, the low contact resistance region 24 may be defined by the region in which the screw head 34 is provided. The low contact resistance region 24 may be a region that is occupied by the screw head 34 or a region immediately above a region that is occupied by the nut 40, as seen from above. Also, in a case in which the nut 40 is formed of plastic, when the nut 40 and the case 50 are integrally formed, a boundary between the nut 40 and the case 50 may not be distinguishable. In this case, the low contact resistance region 24 may be defined by a region in which the screw head 34 is provided.

Also, the low contact resistance region 24 may be a region in which the region which is occupied by the screw head 34 and the region which is occupied by the nut 40 are overlapped, as seen from above. Since the region in which the region occupied by the screw head 34 and the region occupied by the nut 40 are overlapped receives the particularly significant fastening torque, it is possible to largely reduce the contact resistance of the low contact resistance region 24.

Alternatively, the low contact resistance region 24 may be a region that has a boundary enlarged from the region which the screw head 34 or the nut 40 occupies and is defined by a contour line along which the fastening torque is to be applied. The contour line of the fastening torque for defining a region may be selected, in accordance with a predetermined target value for reduction in contact resistance.

Also, the external connection terminal 25 has a shape that is entirely convex toward the upper surface so that the high fastening torque can be easily applied from the screw 32 and the nut 40 to the low contact resistance region 24 upon connection to the bus bar 30. In this case, in the high contact resistance region 22, the bus bar 30 has a small gap from the plated layer 70. However, the upper surface of the external connection terminal 25 may also be planar.

Figure 1D:
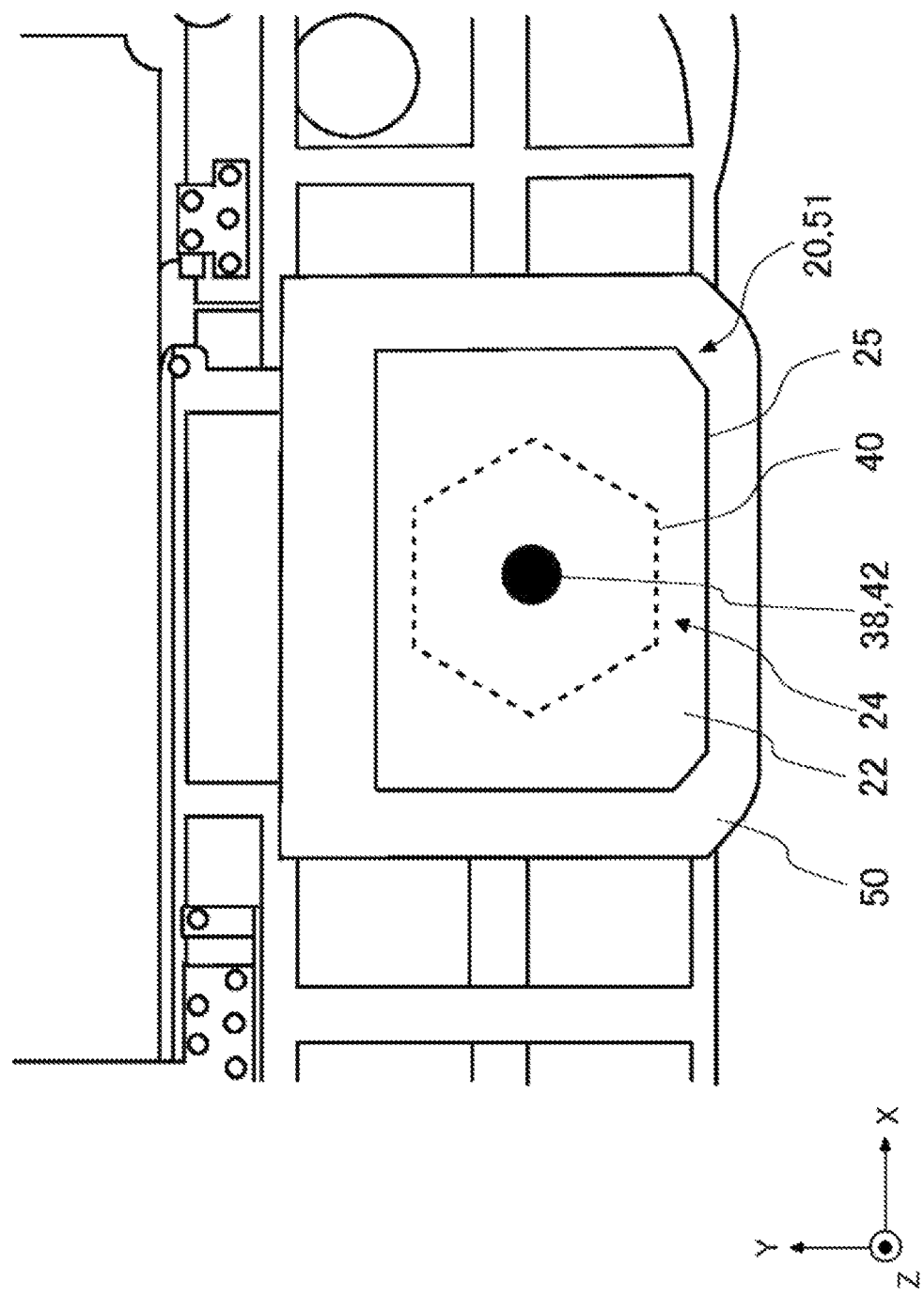
FIG. 1D is an enlarged view of the upper surface of the external connection part 20 before external connection.

FIG. 1D is an enlarged view of the upper surface of the external connection part 20 before external connection. The description 'before external connection' indicates a state before the bus bar 30 is fastened to the external connection terminal 25 by the screw 32. The semiconductor module 100 includes the nut 40 in the case 50. The external connection terminal 25 has the screw hole 38, and the nut 40 has the nut hole 42 of which a center position is common to the screw hole 38.

In the present example, the low contact resistance region 24 is shown as a region defined by the region occupied by the nut 40, as seen from above. In another example, the low contact resistance region 24 may be defined by the region occupied by the screw head 34, as seen from above. Also, in another example, the low contact resistance region may be defined by a contour line of the magnitudes of the fastening torque to be applied.

When the high torque is applied to the entire external connection terminal 25 by enlarging a region in which the fastening torque is to be applied to the external connection terminal 25, the external connection terminal 25 is likely to buckle due to an increase in overall torque. The buckling of the external connection terminal 25 may loosen the fastening between the external connection terminal 25 and the bus bar 30.

As another means for lowering the contact resistance of the external connection terminal 25, there is a means for repeating the fastening with the screw 32 so as to make the external connection terminal 25 and the bus bar 30 conform to each other. In this case, even when the fastening with the screw 32 is repeated, it takes time and labor, so that it is difficult to keep an amount of reduction in contact resistance constant in each trial.

As another means for lowering the contact resistance of the external connection terminal 25, there is a means for using tin or the like, which is a relatively soft material, for the plated layer 70, as an alternative for nickel. In this case, it is possible to lower the contact resistance, irrespective of a state of the fastened surfaces of the external connection terminal 25 and the bus bar 30. However, when the low-hardness material is used for the plated layer 70, the contact surface is likely to be smudged, and the external connection terminal 25 is susceptible to damage and oxidization.

Figure 2A:
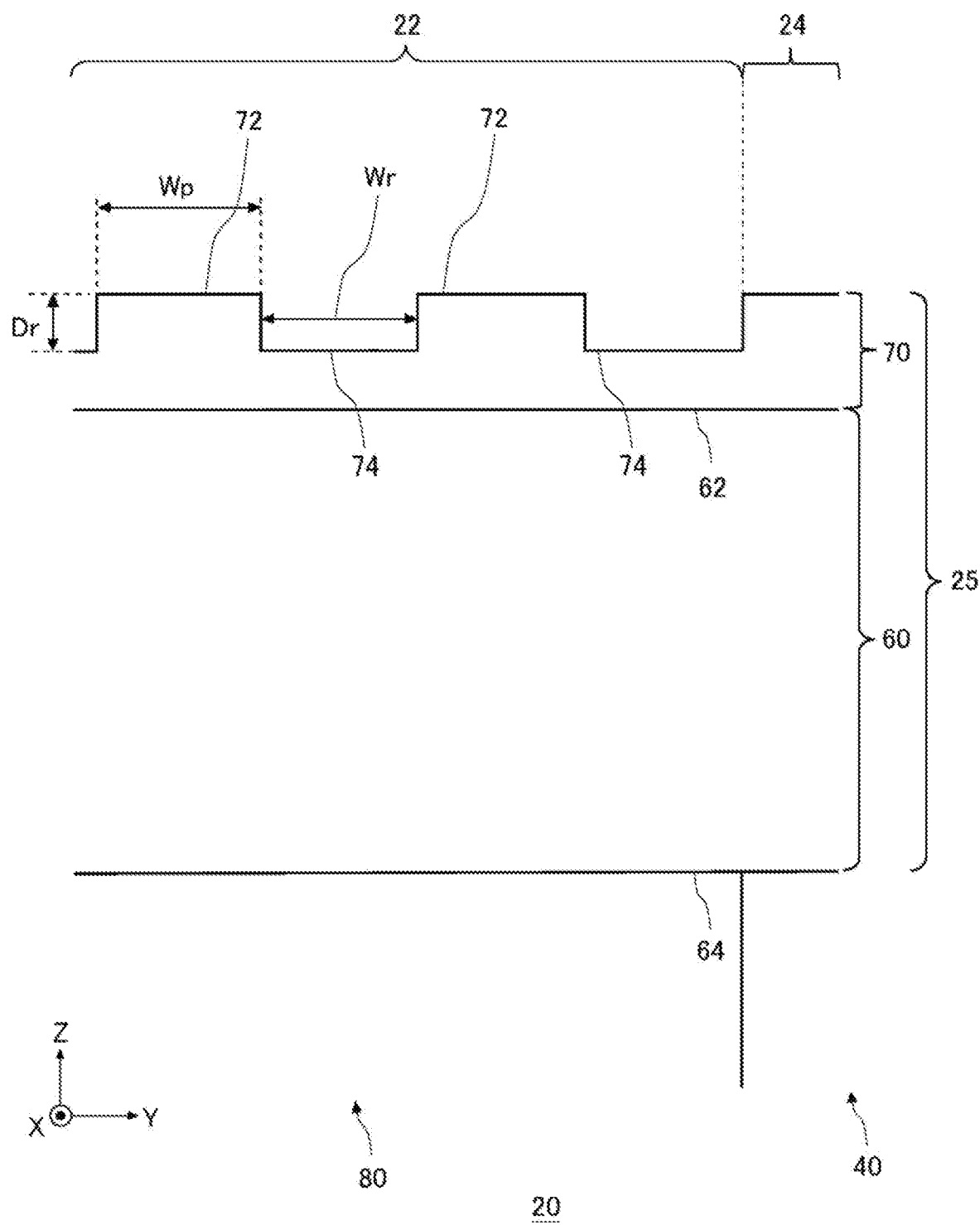
FIG. 2A is an enlarged sectional view of the external connection part 20.

FIG. 2A is an enlarged sectional view of the external connection terminal 25. The plated layer 70 includes convex portions 72 and concave portions 74 in the high contact resistance region 22. In the present example, the plated layer 70 has a thickness between 3.0 µm and 5.0 µm.

In the case in which the high contact resistance region 22 is provided with the convex portions 72 and the concave portions 74, the convex portions 72 in the high contact resistance region 22 are deformed to spread toward the concave portions 74 when the torque is applied to the plated layer 70. Due to the deformation, a surface area of a contact part between the external connection terminal 25 and the bus bar 30 in the high contact resistance region 22 increases. The increase in surface area reduces the contact resistance of the high contact resistance region 22. Sizes of the convex portion 72 and the concave portion 74 are set so that the convex portion 72 can be sufficiently deformed.

A depth Dr indicates a depth from a top surface of the convex portion 72 to a bottom surface of the concave portion 74. The depth Dr may be between 1.5 µm and 2 µm.

The convex portions 72 are aligned in a lattice point shape of a square lattice on the surface of the high contact resistance region 22 of the plated layer 70. However, the convex portions 72 may be aligned in a different pattern, in conformity to a design need, for example, when it is desired to adjust an alignment density of the convex portions 72.

A width Wp indicates a width of the convex portion 72. The width Wp may be between 20 µm and 1 mm. The width Wp is a width in an alignment direction of the convex portions 72, for example.

A width Wr indicates a width of the concave portion 74. That is, the width Wr indicates an interval between the adjacent convex portions 72. The width Wr may be the shortest distance between the adjacent convex portions 72. The width Wr may be between 20 µm and 1 mm. In an example, a ratio of the width Wp and the width Wr is 1:1. However, the width Wp and the width Wr may be different from each other.

The width Wp and the width Wr of the plated layer 70 are appropriately set, so that when the fastening torque is applied to the plated layer 70, the convex portions 72 are sufficiently deformed to increase a contact area between the bus bar 30 and the plated layer 70. Thereby, it is possible to reduce the contact resistance between the bus bar 30 and the plated layer 70 in the high contact resistance region 22.

In the meantime, the high fastening torque is applied between the screw 32 and the nut 40 in the low contact resistance region 24. Therefore, the external connection terminal 25 is pressed hard to the bus bar 30 in the low contact resistance region 24, and the contact resistance in the low contact resistance region 24 is lowered. Therefore, the plated layer 70 may not include the convex portion 72 and the concave portion 74 on the surface in the low contact resistance region 24.

Therefore, the contact resistance of the external connection terminal 25 can be reduced in the high contact resistance region 22 by the deformation of the convex portions 72 on the surface of the plated layer 70, and in the low contact resistance region 24 by the high fastening torque between the screw 32 and the nut 40, respectively. In this way, the contact resistance of the external connection terminal 25 with the bus bar 30 can be reduced over the entire surface of the external connection terminal 25.

Figure 2B:
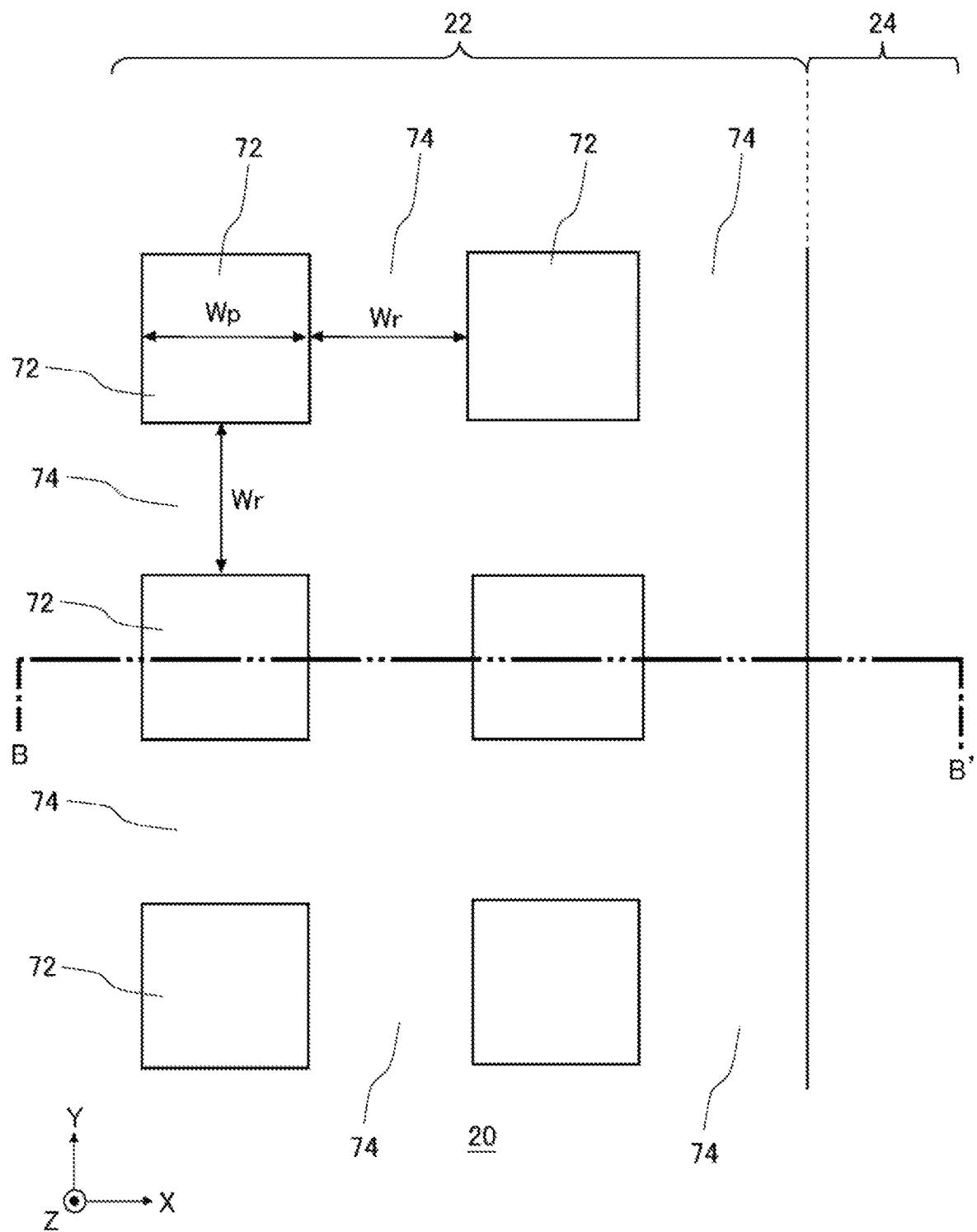
FIG. 2B shows an example of an enlarged view of a surface of the external connection part 20.

FIG. 2B shows an example of an enlarged view of the surface of the external connection part 20. The convex portions 72 and the concave portions 74 are formed by performing reverse sputtering on the plated layer 70 to etch the plated layer 70 corresponding to the concave portions 74.

The convex portion 72 has a quadrangular shape, as seen from above, for example. The intervals between the convex portions 72, as seen from above, can be easily adjusted. However, the shape of the convex portion 72, as seen from above, may have another polygonal shape. In a case in which the convex portion 72 has a regular polygonal shape, it is possible to easily adjust the width Wp of the convex portion.

Also, in a case in which the convex portion 72 has a quadrangular shape, the shape of the convex portion 72 may be a square shape. When the widths of the convex portion 72 in vertical and lateral directions are formed to be the same, the convex portion 72 is more uniformly deformed. Thereby, the contact resistance of the plated layer 70 with the bus bar 30 becomes uniform. Also, the width Wp of the convex portion 72 and the width Wr of the concave portion 74 can be easily regularly aligned with constant intervals, so that it is possible to save the manufacturing cost and the man-hour.

In FIG. 2B, a line B-B' is a line in the alignment direction of the convex portions 72, and passes the concave portions 74. FIG. 2A is an example of a sectional view taken along a line B-B' of FIG. 2B.

Figure 2C:
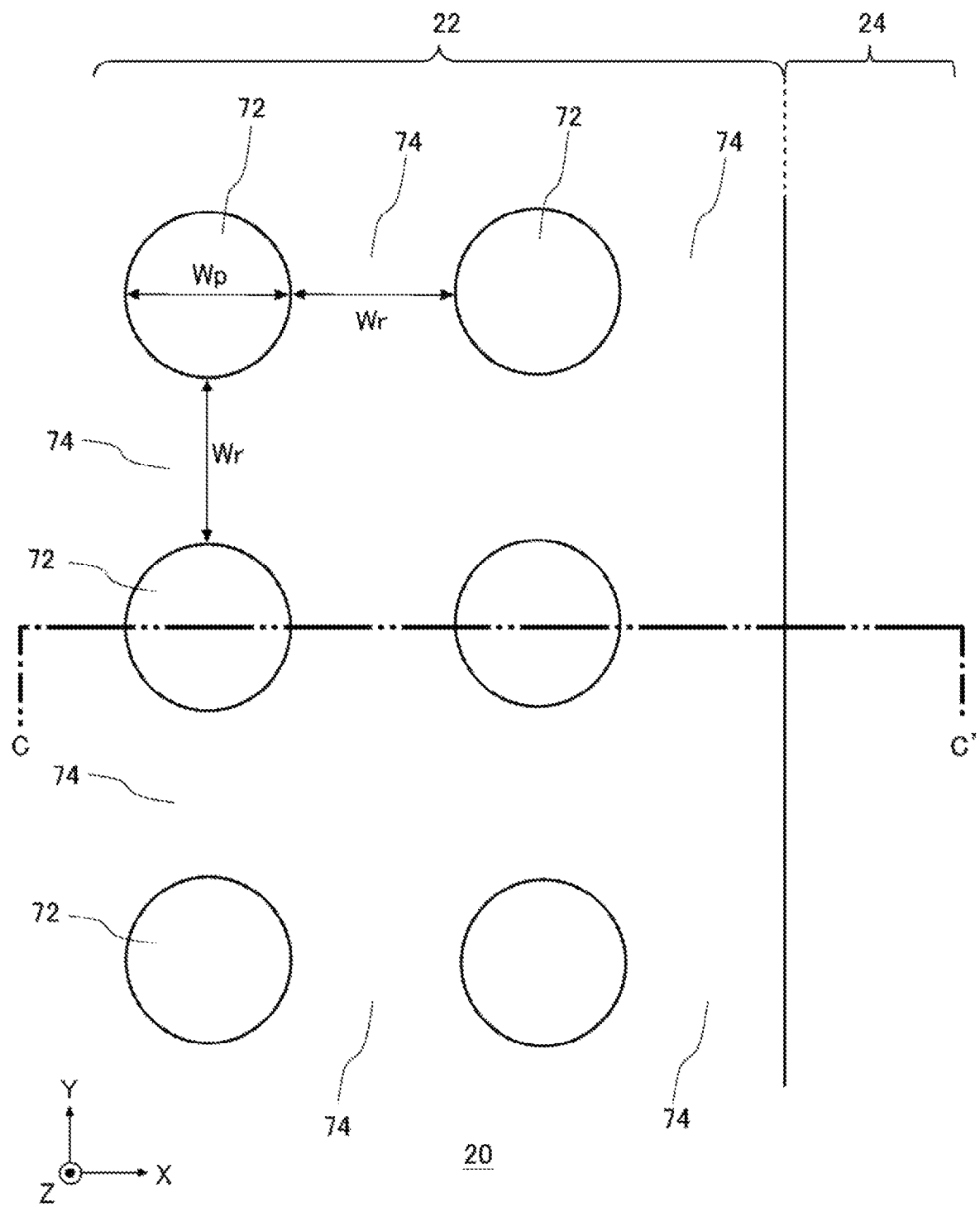
FIG. 2C shows another example of the enlarged view of the surface of the external connection part 20.

FIG. 2C shows another example of the enlarged view of the surface of the external connection part 20. Like the present example, the convex portion 72 may have a circular shape, as seen from above.

Also in the present example, the convex portions 72 may be aligned in a lattice point shape of a square lattice on the surface of the plated layer 70. Also, in the present example, a diameter of the circular convex portion 72 aligned on the plated layer 70 corresponds to the width Wp of the convex portion 72. Also in the present example, the width Wp of the convex portion 72 may be between 20 μm and 1 mm.

A line C-C' is a line passing centers of the aligned circular convex portions 72, located on the same line as the diameters of the convex portions 72, and passing through the low contact resistance region 24. The C-C' section of FIG. 2C is also an example of FIG. 2A, like the B-B' section of FIG. 2B.

Figure 3A:
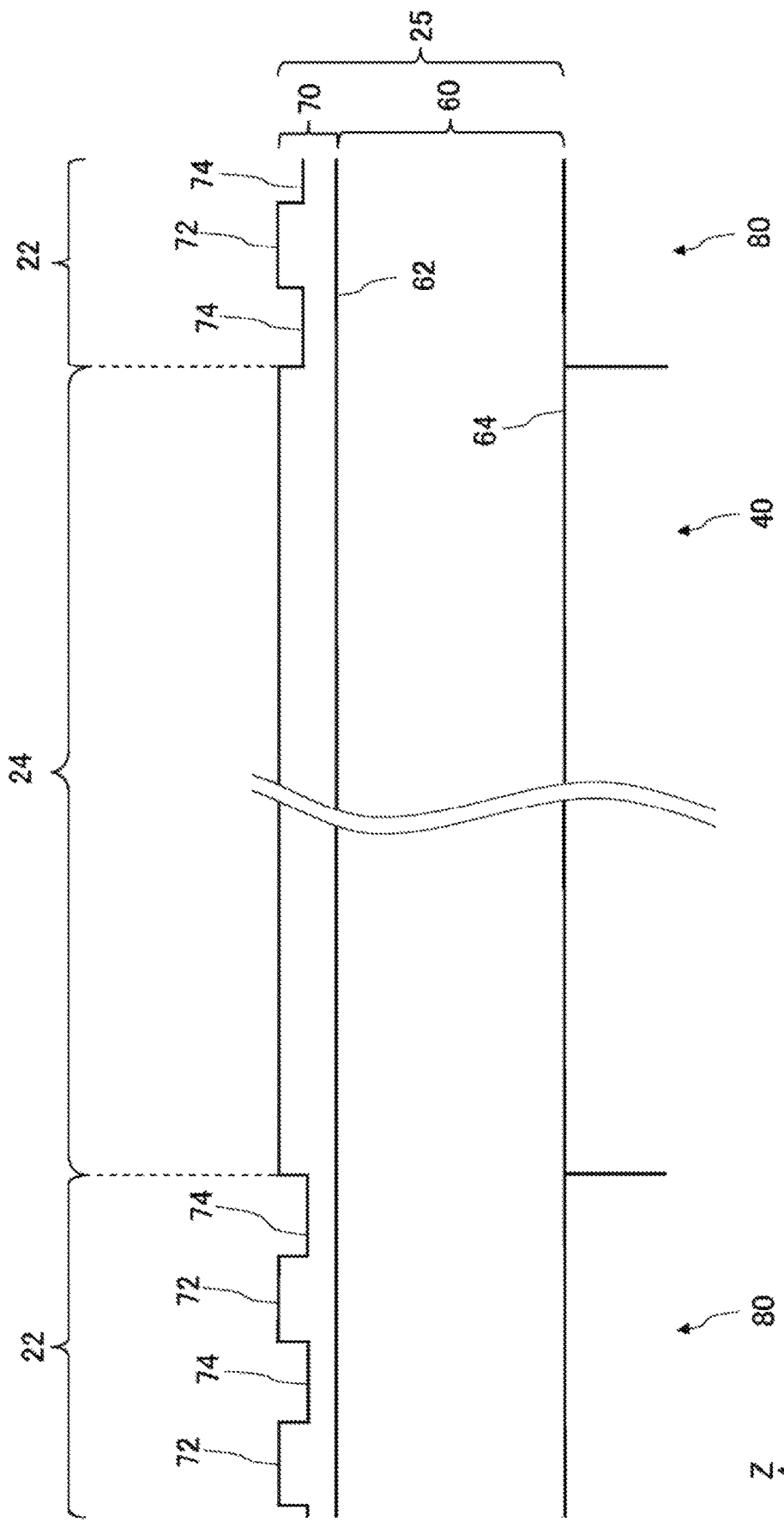
FIG. 3A shows an example of a sectional view of the external connection part 20.

FIG. 3A shows an example of a sectional view of the external connection part 20. In the high contact resistance region 22, the convex portions 72 and the concave portions 74 are provided with equal intervals. In the low contact resistance region 24, the convex portion 72 and the concave portion 74 are not provided.

The plated layer 70 has the same thickness as the convex portion 72, in the low contact resistance region 24. The low contact resistance region 24 has not been subjected to the reverse sputtering.

Figure 3B:
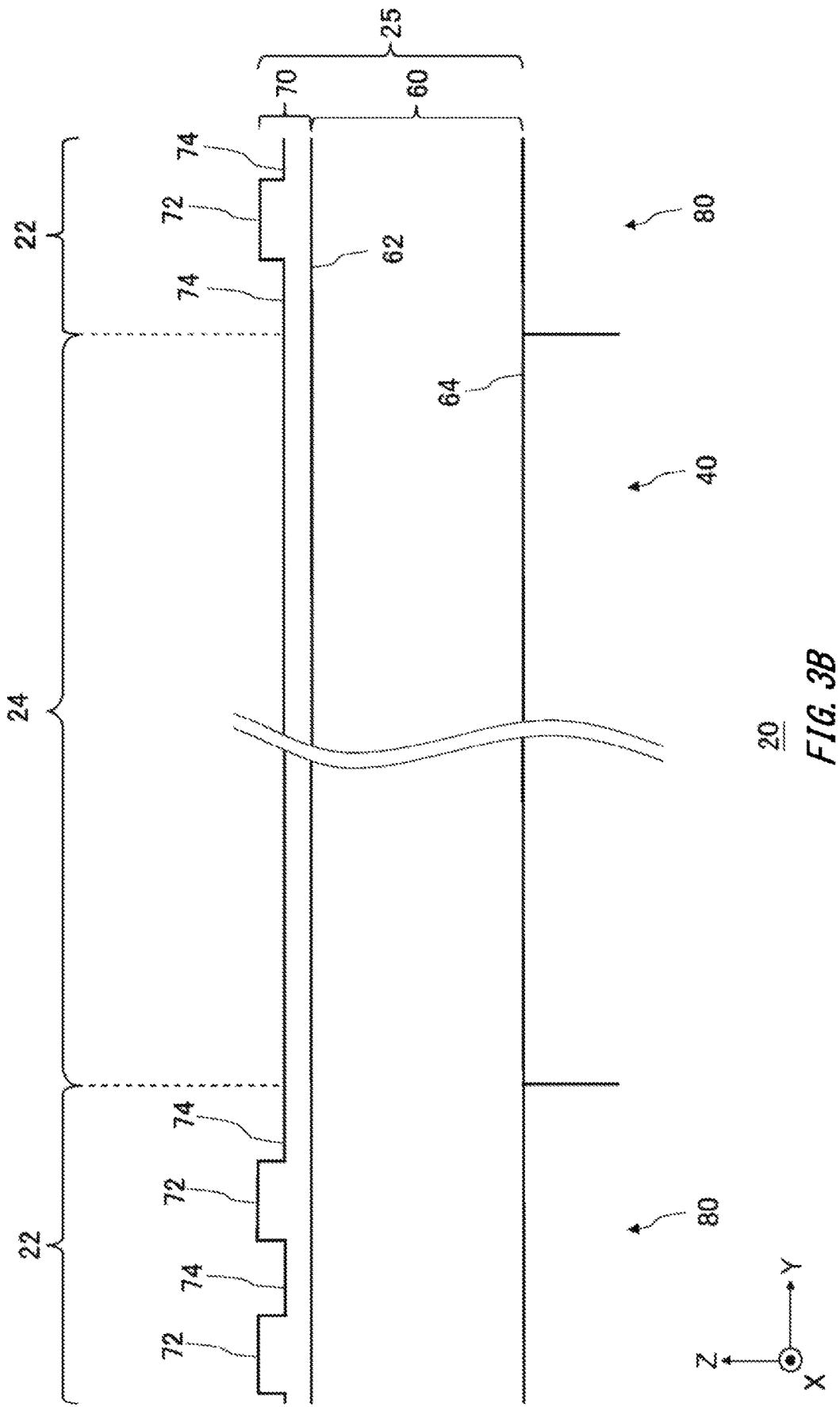
FIG. 3B shows another example of the sectional view of the external connection part 20.

FIG. 3B shows another example of the sectional view of the external connection part 20. The example of FIG. 3B is different from the example of FIG. 3B, in that the low contact resistance region 24 of the plated layer 70 is flush with the concave portions in the high contact resistance region 22.

The plated layer 70 has the same thickness as the concave portion 74, in the low contact resistance region 24. That is, the low contact resistance region 24 has been subjected to the reverse sputtering. The depth from the surface of the plated layer 70 to the conductor 60 in the low contact resistance region 24 is the same as the depth from the surface of the plated layer 70 in the high contact resistance region 22, i.e., the top surface of the convex portion 72 to the conductor 60.

Figure 3C:
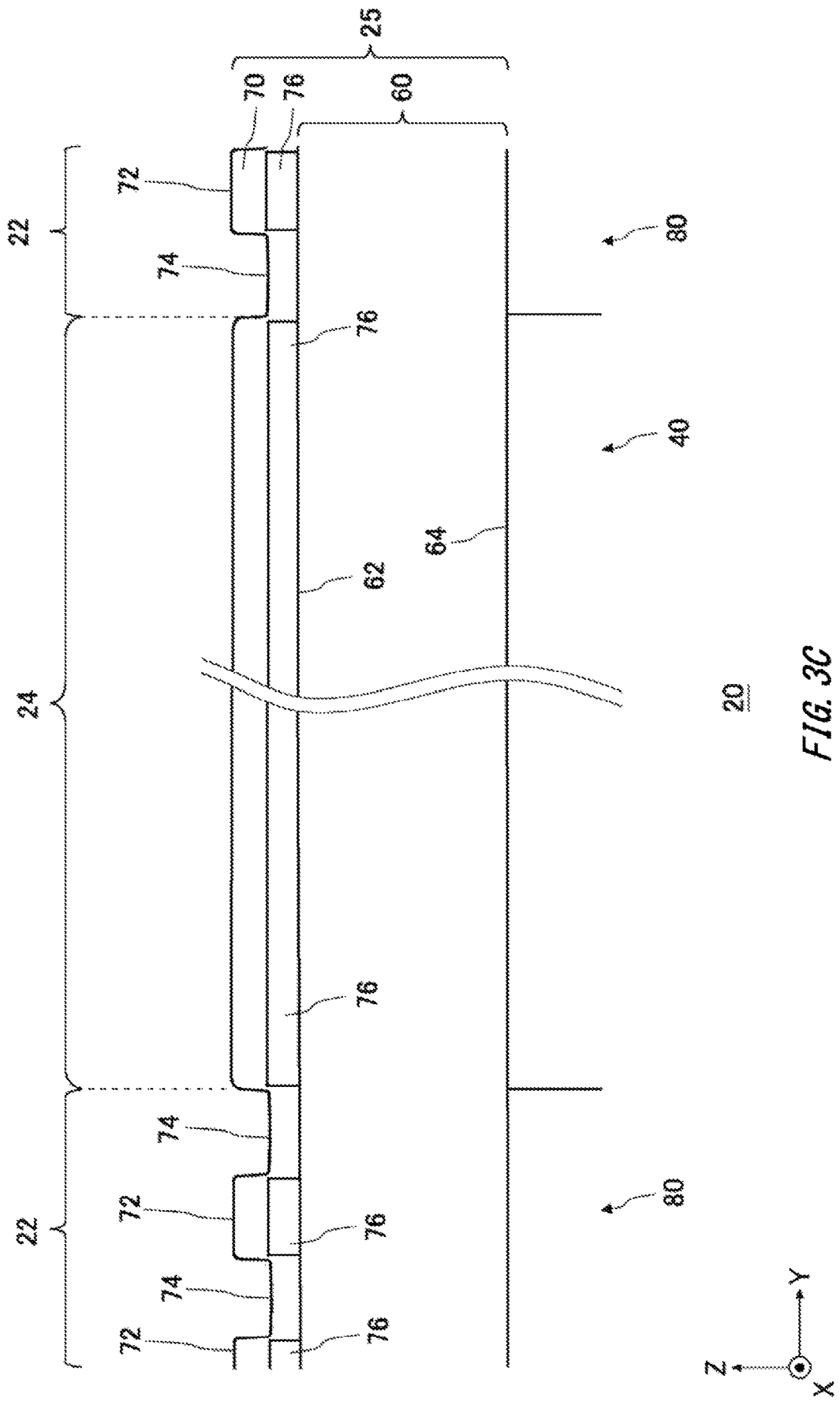
FIG. 3C shows still another example of the sectional view of the external connection part 20.

FIG. 3C shows still another example of the sectional view of the external connection part 20. The example of FIG. 3C is different from the examples of FIGS. 3A and 3B, in that pattern layers 76 are provided between the conductor 60 and the plated layer 70. In the present example, the convex portions 72 and the concave portions 74 in the high contact resistance region 22 may be provided without performing the reverse sputtering.

The pattern layers 76 are arranged in positions, in which the convex portions 72 are to be provided, on the surface of the plated layer 70. That is, the pattern layers 76 may be provided in accordance with the arrangement pattern of the convex portions 72 shown in FIGS. 2B and 2C. The pattern layer 76 may be formed of a material causing the pattern layer 76 not to be largely deformed when the plated layer 70 is provided, for example, resin, metal, or the like.

A width of the pattern layer 76 is the width Wp of the convex portion 72. Also, an arrangement interval between the pattern layers 76 is the width Wr of the concave portion 74. In this case, when the plated layer 70 is provided above the conductor 60 and the pattern layers 76, the convex portions 72 as shown in FIGS. 2B and 2C can be formed.

A height of the pattern layer 76 is the same as the depth Dr from the top surface of the convex portion 72 to the bottom surface of the concave portion 74. With respect to the pattern layer 76 having such height, when the plated layer 70 is provided above the conductor 60 and the pattern layers 76 to fill spaces between the pattern layers 76, the convex portions 72 having the depth Dr are provided and the pattern layers 76 are not exposed to the surface of the external connection terminal 25. However, the pattern layers 76 may be provided to have different heights.

In the present example, after providing the pattern layers 76 on the upper surface 62 of the conductor 60, the pattern layers 76 and the upper surface 62 of the conductor 60 are covered by the plated layer 70. Also in this case, the arrangement of the plated layer 70, as seen from above, depends on the arrangement of the pattern layers 76.

Figure 4A:
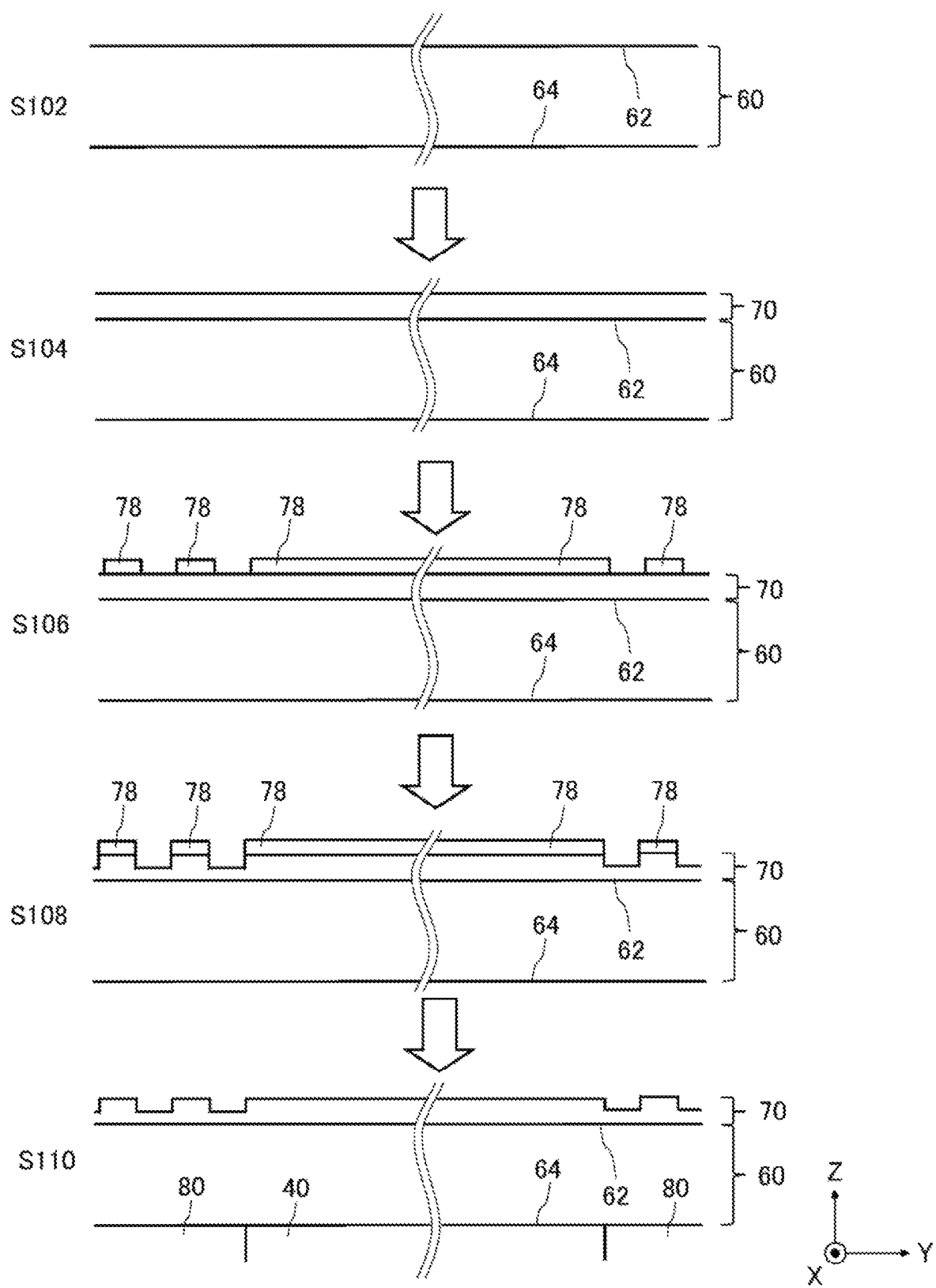
FIG. 4A shows an example of a manufacturing method of an external connection terminal 25.

FIG. 4A shows an example of a manufacturing method of the external connection terminal 25. The manufacturing method of the present example includes steps from S102 to S110.

In S102, the conductor 60 having the upper surface 62 and the lower surface 64 is provided. As an example, for the conductor 60, metal such as copper is used.

In S104, the upper surface 62 of the conductor 60 is covered by the plated layer 70. The plated layer 70 may be a nickel-plated layer.

In S106, pattern layers 78 are arranged in regions on the surface of the plated layer 70, the regions corresponding to the high contact resistance region 22 and the low contact resistance region 24. In the high contact resistance region 22, the pattern layers 78 are uniformly provided. Also, in the low contact resistance region 24, the pattern layer 78 is provided in correspondence to the convex portion 72. For example, the pattern layer 78 is provided with a resist resin.

In S108, the reverse sputtering is performed on the plated layer 70 by using the pattern layers 78 as a mask. In the reverse sputtering processing, ions are ejected onto the plated layer 70, so that the plated layer 70 is etched. In S108, a depth of the reverse sputtering is the depth Dr from the top surface of the convex portion 72 to the bottom surface of the concave portion 74. The depth Dr may be between 1.5 µm and 2 µm.

Since the pattern layers 78 are used as an etching mask in the reverse sputtering, a shape of the pattern layers 78 determines shapes of the convex portion 72 and the concave portion 74. The shape of the convex portion 72 may be a quadrangular shape, a different polygonal shape, or a circular shape.

The width Wp of the convex portion 72 corresponds to a width of the pattern layer 78. The reason is that the shape of the convex portion 72 depends on the shape of the pattern layer 78 to be used as a mask. The width Wr of the concave portion 74 corresponds to an arrangement interval of the pattern layers 78.

In S110, the pattern layers 78 are removed. Therefore, no layer including the pattern layers is provided between the conductor 60 and the plated layer 70. In the process from S102 to S110, the pattern layer 78 is also arranged in a region corresponding to the low contact resistance region 24 and the reverse sputtering is then performed. In the process of the present example, since the high contact resistance region 22 is etched by the reverse sputtering, it is possible to precisely adjust the shapes of the convex portion 72 and the concave portion 74.

Also, in S110, the external connection terminal 25 in the completed example of FIG. 3A is provided in the case 50. In the case 50, the nut 40 is provided in a position corresponding to the low contact resistance region 24 on the lower surface 64-side of the conductor 60, and the nut 40 is resin-sealed by the resin 80. By the above processing, the external connection part 20 in the completed example of FIG. 3A is provided in the case 50.

Figure 4B:
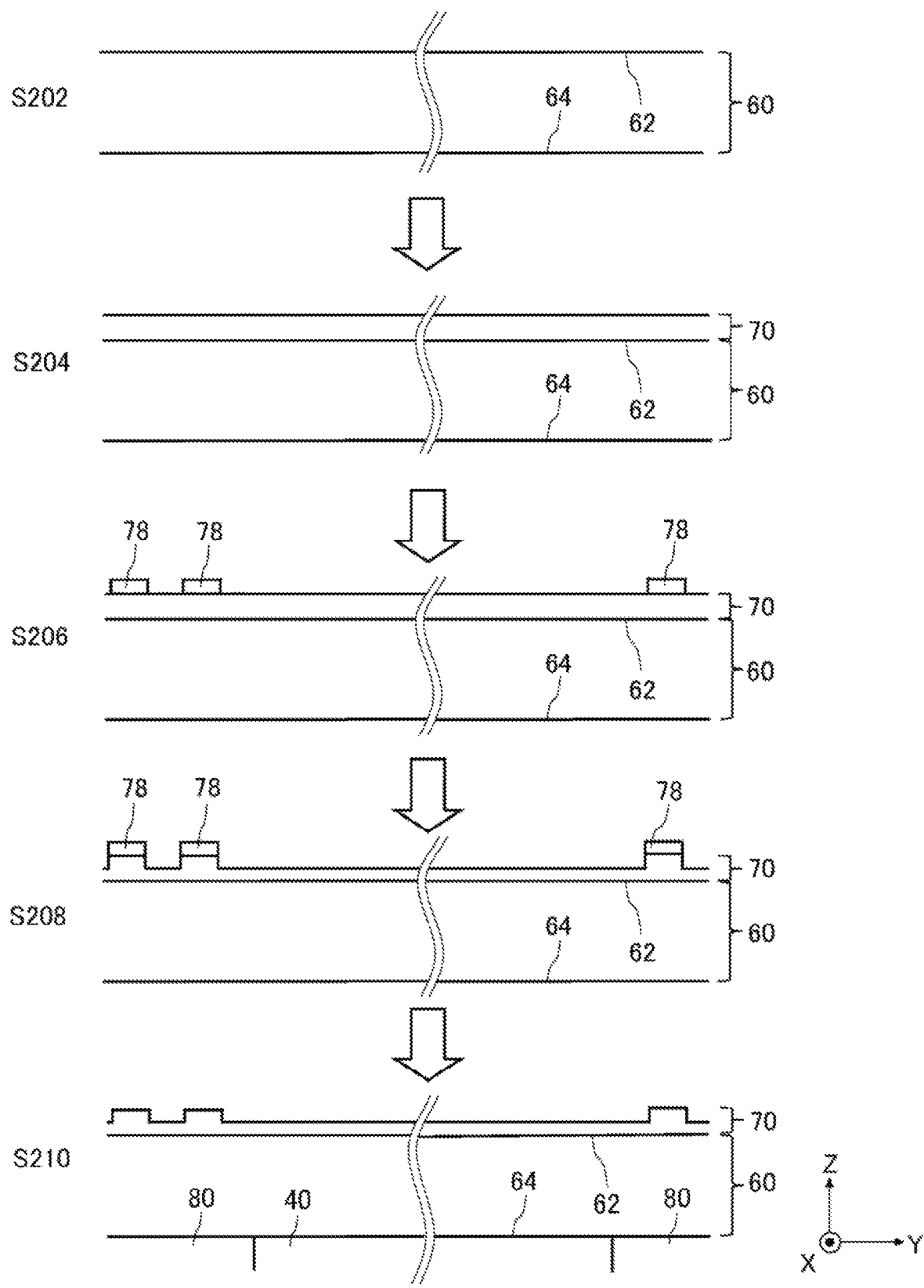
FIG. 4B shows another example of the manufacturing method of the external connection terminal 25.

FIG. 4B shows another example of the manufacturing method of the external connection terminal 25. The manufacturing method of the present example includes steps from S202 to S210.

The manufacturing method of the present example is different from the manufacturing method including steps from S102 to S110, in that the pattern layer 78 is not arranged in a region corresponding to the low contact resistance region 24 in S206. In the manufacturing method of the present example, in S208, an entire region on the surface of the plated layer 70, which corresponds to the low contact resistance region 24, is etched by the reverse sputtering.

In the manufacturing method of the present example, the entire region corresponding to the low contact resistance region 24 is etched to the same height as the concave portion 74 in the high contact resistance region 22. Therefore, in the region corresponding to the low contact resistance region 24 after removing the pattern layer 78, the surface of the plated layer 70 becomes a surface lower than the surface of the plated layer 70 in the high contact resistance region 22, i.e., the top surface of the convex portion 72 by the depth Dr. In the manufacturing method of the present example, the depth from the surface of the plated layer 70, i.e., the top surface of the convex portion 72 to the upper surface 62 of the conductor 60 in the high contact resistance region 22 is greater than the depth from the surface of the plated layer 70 to the upper surface 62 of the conductor 60 in the low contact resistance region 24.

In S210, the pattern layers 78 are removed. In the manufacturing method including steps from S102 to S110 and the manufacturing method including steps from S202 to S210, since the pattern layers 78 are removed, the external connection terminal 25 does not include the pattern layer 78 between the conductor 60 and the plated layer 70.

Also, in S210, the external connection terminal 25 in the completed example of FIG. 3B is provided in the case 50. In the case 50, the nut 40 is provided in a position corresponding to the low contact resistance region 24 on the lower surface 64-side of the conductor 60, and the nut 40 is resin-sealed by the resin 80. By the above process, the external connection part 20 in the completed example of FIG. 3B is provided in the case 50.

Figure 4C:
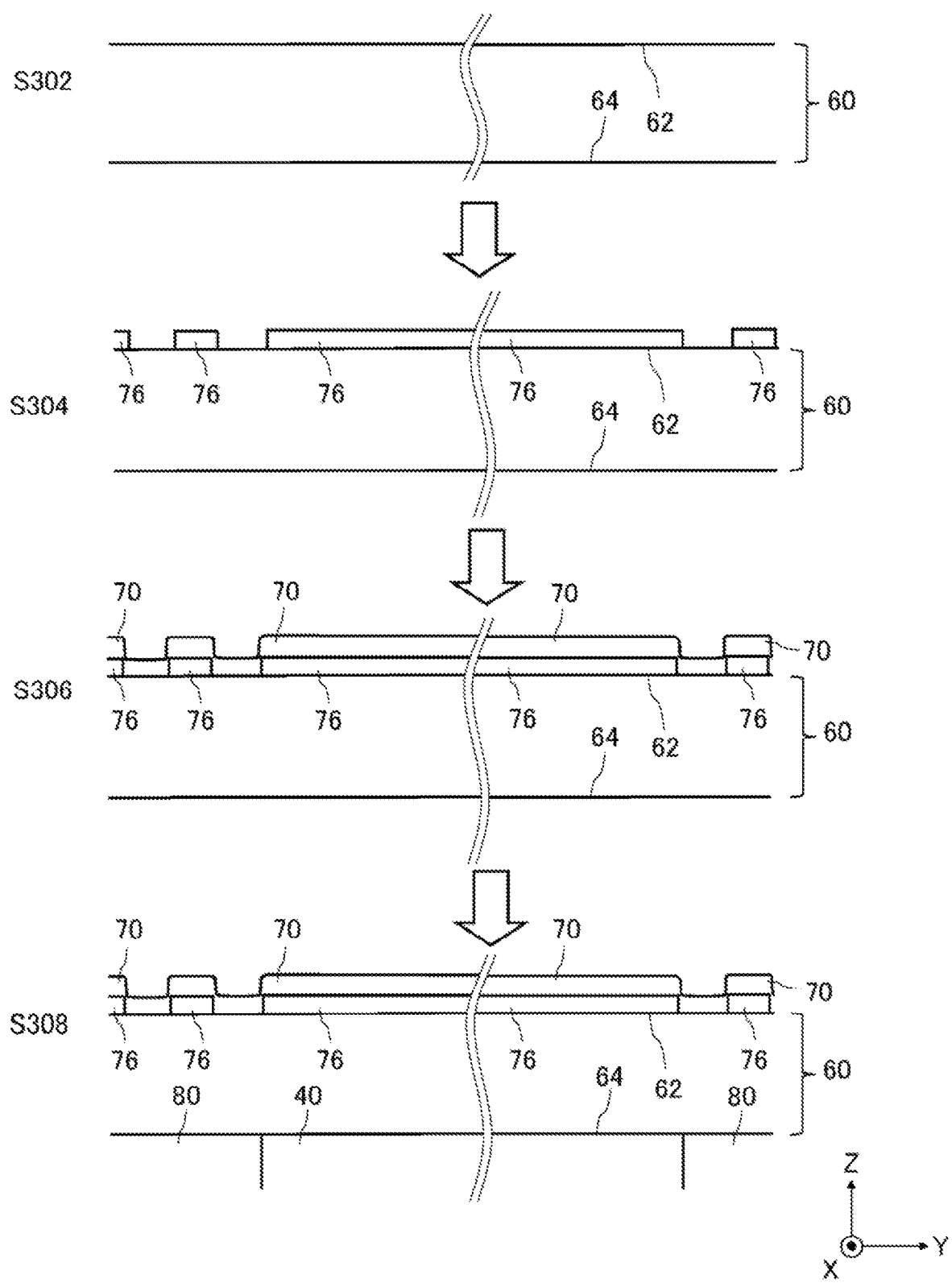
FIG. 4C shows still another example of the manufacturing method of the external connection terminal 25.

FIG. 4C shows still another example of the manufacturing method of the external connection terminal 25. The manufacturing method of the present example includes steps from S302 to S310.

In S302, as with S102 and S202, the conductor 60 having the upper surface 62 and the lower surface 64 is provided. As an example, for the conductor 60, metal such as copper is used.

In S304, the pattern layers 76 are arranged on the upper surface 62 of the conductor 60. The shape of the convex portion 72 may be a quadrangular shape, a different polygonal shape, or a circular shape.

In S306, the plated layer 70 is provided on the upper surface 62 of the conductor 60 and the pattern layers 76. The plated layer 70 may fill spaces between the pattern layers 76 or may not completely fill the spaces between the pattern layers 76.

The convex portions 72 and the concave portions 74 in the high contact resistance region 22 are provided by providing the plated layer 70 on the upper surface 62 of the conductor 60 and the pattern layers 76. Therefore, in the present example, it is possible to provide the convex portions 72 and the concave portions 74 on the surface of the plated layer 70, without performing the reverse sputtering.

In the present example, the depth Dr from the top surface of the convex portion 72 to the bottom surface of the concave portion 74 is determined by a depth in which the plated layer is provided. The depth Dr may be between 1.5 µm and 2.5 µm.

The shape of the convex portion 72 corresponds to the shape of the pattern layer 76, like the manufacturing method including steps from S102 to S110 and the manufacturing method including steps from S202 to S210. The reason is that the convex portion 72 is provided by providing the plated layer 70 on the pattern layer 76.

The width of the concave portion 74 corresponds to the arrangement interval of the pattern layer 76 in S102, like the manufacturing method including steps from S102 to S110 and the manufacturing method including steps from S202 to S210. Since the plated layer 70 fills the spaces between the pattern layers 76, the distance of the concave portion 74 corresponds to the distance between the pattern layers 76.

In S308, the external connection terminal 25 completed in the example of FIG. 3C is provided in the case 50. In the case 50, the nut 40 is provided in a position corresponding to the low contact resistance region 24 on the lower surface 64-side of the conductor 60, and the nut 40 is resin-sealed by the resin 80. By the above processing, The external connection part 20 completed in the example of FIG. 3C is provided in the case 50.

In the present example, since the convex portion 72 and the concave portion 74 can be formed, irrespective of the reverse sputtering, it is possible to simplify the process and to save the cost. The external connection terminal 25 of the present example is different from the external connection terminal 25 to be manufactured by the manufacturing method including steps from S102 to S110 and the manufacturing method including steps from S202 to S210, in that it includes the pattern layer 76 provided between the conductor 60 and the plated layer 70.

Figure 5A:
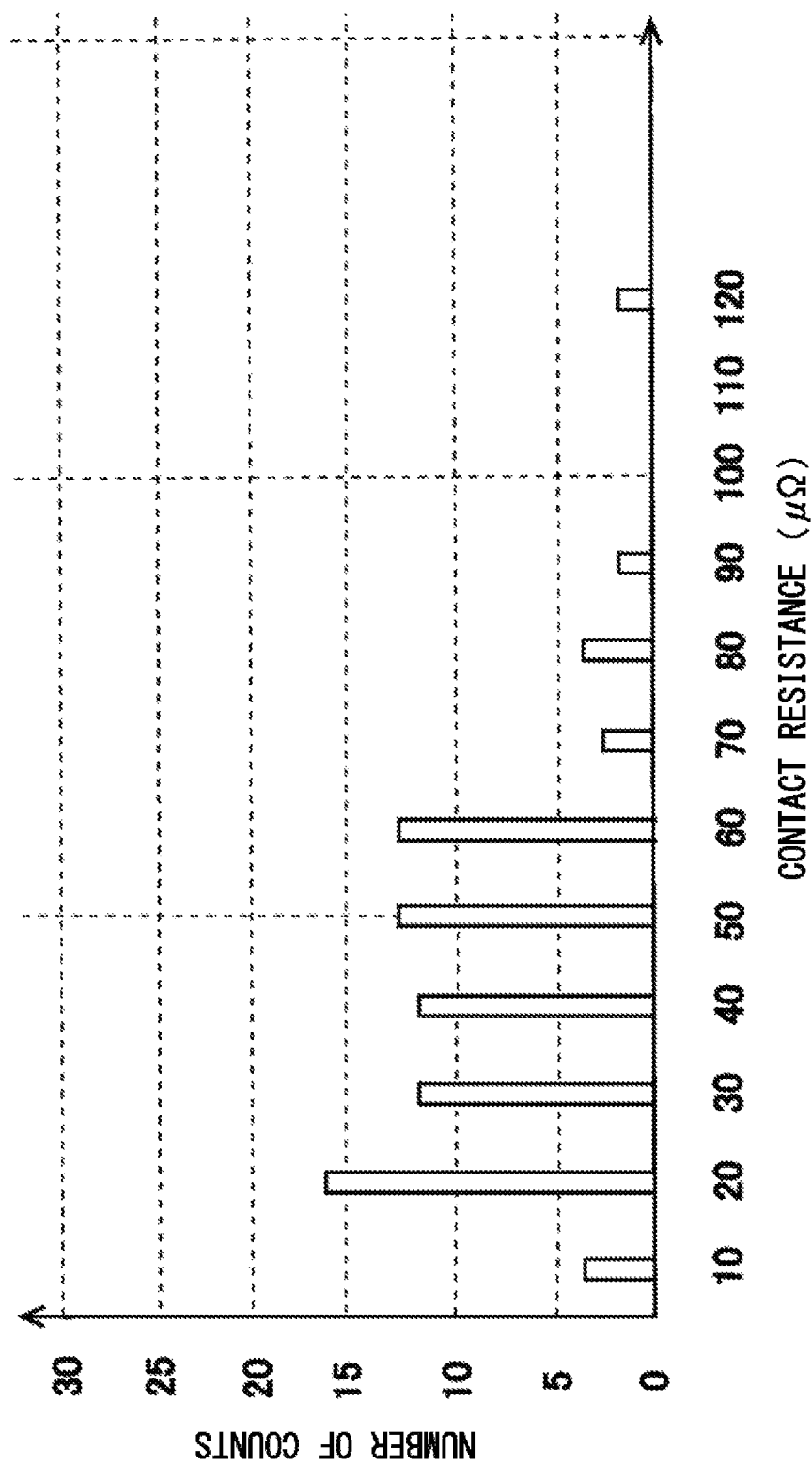
FIG. 5A is a histogram showing a distribution of contact resistances on a surface of an external connection terminal 150 in accordance with Comparative Example.

FIG. 5A is a histogram showing a distribution of contact resistances on a surface of an external connection terminal 150 in accordance with Comparative Example. In a semiconductor module 500 of Comparative Example, the convex portion 72 and the concave portion 74 are not provided on a surface of a plated layer 155 of the external connection terminal 150, unlike the external connection terminal 25 of the semiconductor module 100. The graph is a bar graph obtained by measuring the contact resistance on the surface of the external connection terminal 150 (the number of times of measurement N=100) and counting the frequency for each contact resistance value of 10 μΩ. The external connection terminal 150, the plated layer 155, and the semiconductor module 500 are not shown.

The contact resistances of the external connection terminal 150 are distributed over a wide range including a value of 120 μΩ. The smaller the contact resistance of the external connection terminal 150 is, the better its property is. Particularly, in a case in which the semiconductor module 500 is a device in which a high voltage of 800 V or higher is used, even a resistance of the order of several 10 μΩ causes heat generation and voltage drop.

When a human finger is touched to the semiconductor module 500 and the plated layer 155, for example, siloxane produced by silicon that reacts with potassium and sodium present in human sebum is attached to the plated layer 155. Siloxane is one of main causes of increasing the contact resistance of the plated layer 155.

Figure 5B:
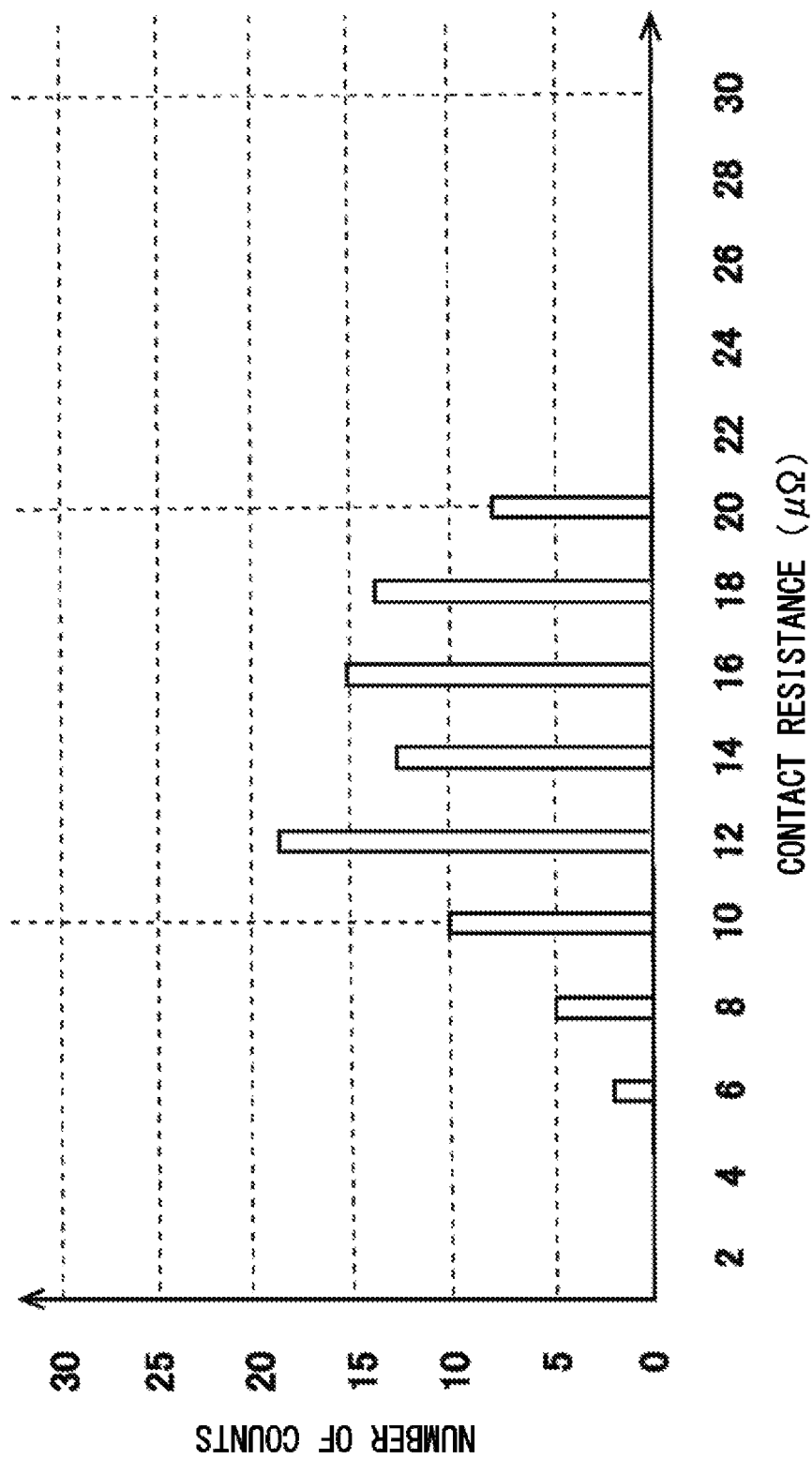
FIG. 5B is a histogram showing a distribution of the contact resistances after the surface of the external connection terminal 150 in accordance with Comparative Example is cleaned with ethanol.

FIG. 5B is a histogram showing a distribution of the contact resistances after the surface of the external connection terminal 150 in accordance with Comparative Example is cleaned with ethanol. The graph is a bar graph obtained by measuring the contact resistance on the surface of the external connection terminal 150 (the number of times of measurement N=100) and counting the frequency for each contact resistance value of 2 μΩ. After cleaning the surface of the external connection terminal 150 used in the test of FIG. 5A with ethanol, the similar measurement was performed, so that its result is shown with the bar graph.

Siloxane produced on the plated layer 155 of the external connection terminal 150 can be cleaned with ethanol. After cleaning siloxane with ethanol, the number of counts of the contact resistance on the plated layer 155 of the external connection terminal 150 was concentrated within a range of 20 μΩ or lower.

Figure 5C:
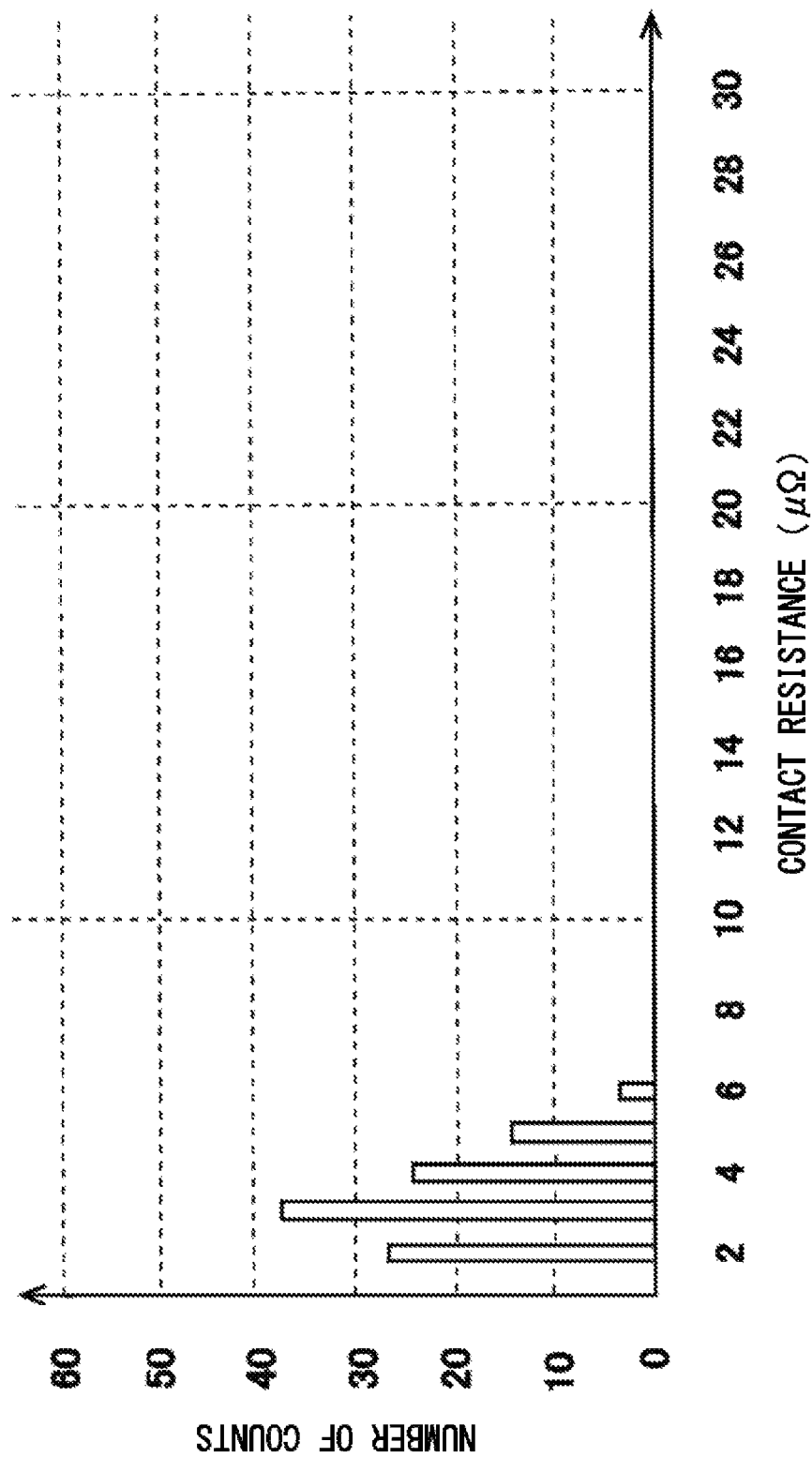
FIG. 5C is a histogram showing a distribution of contact resistances of the external connection terminal 25.

FIG. 5C is a histogram showing a distribution of contact resistances of the external connection terminal 25. The graph is a bar graph obtained by measuring the contact resistance on the surface of the external connection terminal 25 (the number of times of measurement N=100) and counting the frequency for each contact resistance value of 1 μΩ. The contact resistance was measured without cleaning the surface of the external connection terminal 25 with ethanol.

The contact resistance of the high contact resistance region 22 of the external connection terminal 25 is that the convex portions 72 and the concave portions 74 are provided on the surface and the plated layer 70 can be thus easily deformed by the fastening torque to be applied between the screw 32 and the nut 40. When the fastening torque is applied, the convex portions 72 are deformed, so that the external connection terminal 25 is pressed against the bus bar 30. Therefore, even when there is a distribution difference of the fastening torques over the surface of the external connection terminal 25, it is possible to sufficiently reduce the contact resistance of the high contact resistance region 22.

The contact resistance of the low contact resistance region 24 of the external connection terminal 25 is sufficiently reduced by the fastening torque. Therefore, the contact resistance is reduced in any of the high contact resistance region 22 and the low contact resistance region 24.

When the external connection terminal 25 is used, the contact resistance is concentrated on a range of 5 μΩ or lower, even though the operation of cleaning siloxane with ethanol is not performed. FIG. 5C shows a test result in which the width Wp of the convex portion 72 is 100 μm and the width Wr of the concave portion 74 is 100 μm. In a case in which the width Wp of the convex portion 72 is between 20 and 1 mm and the width Wr of the concave portion 74 is between 20 μm and 1 mm, the contact resistance is concentrated on a range of 5 μΩ or lower.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An external connection part of a semiconductor module, the external connection part comprising:
   a conductor having an upper surface and a lower surface;
   a plated layer configured to cover the upper surface of the conductor; and
   a nut provided on the lower surface-side of the conductor for receiving a screw penetrating the conductor,
   wherein the plated layer comprises a low contact resistance region overlapping a region in which the nut is provided, and a high contact resistance region that is a region except the low contact resistance region, as seen from above, and
   the plated layer comprises a convex portion and a concave portion on a surface in the high contact resistance region.

2. The external connection part according to claim 1, wherein
   a depth from a top surface of the convex portion to a bottom surface of the concave portion is between 1.5 μm and 2.5 μm.

3. The external connection part according to claim 2, wherein
   the convex portion has a width between 20 μm and 1 mm.

4. The external connection part according to claim 1, wherein
the convex portion has a quadrangular shape, as seen from above.

5. The external connection part according to claim 1, wherein
the convex portion has a circular shape, as seen from above.

6. The external connection part according to claim 2, wherein
the concave portion has a width between 20 μm and 1 mm.

7. The external connection part according to claim 1, wherein
the plated layer comprises nickel.

8. The external connection part according to claim 1, wherein
the plated layer does not include a convex portion and a concave portion on a surface in the low contact resistance region.

9. The external connection part according to claim 1, wherein
a depth from a surface of the plated layer to the upper surface of the conductor in the high contact resistance region is the same as a corresponding depth in the low contact resistance region.

10. The external connection part according to claim 1, wherein
a depth from a surface of the plated layer to the upper surface of the conductor in the high contact resistance region is greater than a corresponding depth in the low contact resistance region.

11. The external connection part according to claim 1, comprising
a pattern layer provided between the conductor and the plated layer.

12. The external connection part according to claim 1, wherein
no pattern layer is provided between the conductor and the plated layer.

13. A semiconductor module comprising:
the external connection part according to claim 1;
a case,
an insulating substrate housed in the case; and
a semiconductor chip electrically connected to the external connection part and provided above the insulating substrate.

14. An external connection terminal of a semiconductor module, the external connection terminal comprising:
a conductor having an upper surface and a lower surface;
a plated layer configured to cover the upper surface of the conductor; and
a screw hole formed to penetrate the conductor and the plated layer,
wherein the plated layer comprises a low contact resistance region surrounding the screw hole, and a high contact resistance region surrounding the low contact resistance region, as seen from above, and
the plated layer comprises a convex portion and a concave portion on a surface in the high contact resistance region.

* * * * *